United States Patent [19]

Gomi et al.

[11] 4,321,698
[45] Mar. 23, 1982

[54] TEMPERATURE COMPENSATED QUARTZ WRISTWATCH WITH MEMORY STORED PREDETERMINED TEMPERATURE COMPENSATING DATA

[75] Inventors: Tsuguo Gomi; Osamu Takeda, both of Suwa, Japan

[73] Assignee: Kabushiki Kaisha Suwa Seikosha, Tokyo, Japan

[21] Appl. No.: 225,933

[22] Filed: Jan. 19, 1981

Related U.S. Application Data

[63] Continuation of Ser. No. 10,192, Feb. 7, 1979, abandoned.

[30] Foreign Application Priority Data

Feb. 7, 1978 [JP] Japan .................................. 53-12647

[51] Int. Cl.³ ............................................. G04C 19/00
[52] U.S. Cl. ..................................... 368/202; 368/200
[58] Field of Search ................................ 368/200-202

[56] References Cited

U.S. PATENT DOCUMENTS

| | | | |
|---|---|---|---|
| 3,812,669 | 5/1974 | Wiget | 368/201 |
| 3,895,486 | 7/1975 | Hammer et al. | 368/201 |
| 4,015,208 | 3/1977 | Hammer et al. | 328/29 |

Primary Examiner—Bruce A. Reynolds
Assistant Examiner—Bernard Roskoski
Attorney, Agent, or Firm—Blum, Kaplan, Friedman, Silberman & Beran

[57] ABSTRACT

A quartz crystal wristwatch is temperature compensated by applying additional pulses to the divider circuit. The number and frequency of application of the additional pulses is stored in memory and based upon mean temperature data for the worn wristwatch on an hourly or monthly basis. The oscillator itself uses little or no temperature compensation.

20 Claims, 9 Drawing Figures

TEMPERATURE COMPENSATED QUARTZ WRISTWATCH WITH MEMORY STORED PREDETERMINED TEMPERATURE COMPENSATING DATA

This is a continuation of application Ser. No. 10,192, filed Feb. 7, 1979, now abandoned.

BACKGROUND OF THE INVENTION

This invention relates generally to a quartz crystal wristwatch for timekeeping and more particularly to a quartz crystal wristwatch where temperature compensation is provided by modifying the output signals which are outputted from the divider network receiving the high frequency signal from the quartz crystal oscillator circuit. The quartz crystal wristwatch of this invention has a controlling device for reading the contents of a memory means where data indicating the required magnitude of frequency correction is stored, and for generating a compensation signal corresponding to the contents of the memory means. The amount of compensation which is required is calculated from the predicted temperature of the wristwatch when it is worn.

In the prior art, in a conventional method of temperature compensation for a quartz crystal wristwatch, the temperature-compensated output of the oscillator is obtained by adding a temperature sensitive element to the quartz crystal oscillator. One condenser having a capacity-temperature characteristic is generally used as the temperature sensitive element. Timekeeping accuracy can be obtained to some degree by this prior art method. The timekeeping accuracy is represented as a monthly rate of plus or minus 10 to plus or minus 20 seconds. It is impossible to achieve a superior timekeeping accuracy by providing only a single variable condenser. So, it is then necessary to add a condenser for controlling the condenser having the temperature-capacity characteristic. In such a situation, adding the condenser limits the space available for other elements for conducting the functions normal to the timepiece, and makes the design for attaining timekeeping accuracy very complicated. Furthermore, manufacturing costs are raised by temperature compensating by means of additional components.

There are many other methods in the prior art for obtaining the temperature compensated output of an oscillator, but these methods when applied have many disadvantages in terms of space requirements, complexity, cost and the like.

What is needed is a quartz crystal wristwatch which is temperature compensated without the need to compensate the oscillator circuit per se by means of additional components. It is also desirable that any temperature compensating device be adaptable to integrated circuit design.

SUMMARY OF THE INVENTION

Generally speaking, in accordance with the invention, a quartz crystal wristwatch with temperature compensation is provided. The writswatch of this invention is temperature compensated by applying additional pulses to a stage of the divider circuit. The number and/or frequency of application of the additional pulses is stored in memory and based upon mean temperature data for the worn wristwatch during predetermined time periods such as hourly or monthly. The oscillator itself needs little or no temperature compensation.

In the quartz crystal wristwatch of this invention, the output of the oscillator, which is not temperature compensated or is only slightly temperature compensated, is controlled through electronic circuit means making the watch output respond to the condition in which the wristwatch is worn by the user, to thereby obtain a temperature compensated timekeeping signal. It is not very important to obtain a temperature compensated output from the oscillator per se in this invention as explained hereinafter.

Many advantages materialize when such a wristwatch is produced. For instance, the quartz crystal oscillator is provided in the simplest construction. A timekeeping accuracy much higher than that of the conventional wristwatch is provided. The temperature compensating device is incorporated into the integrated circuit board, and the amount of temperature compensation is freely changed according to specifications.

Accordingly, it is an object of this invention to provide an improved quartz crystal wristwatch which is temperature compensated without temperature compensating the oscillator per se or with minimal oscillator compensation.

Another object of this invention is to provide a quartz crystal wristwatch wherein temperature compensation is based on data stored in memory.

A further object of this invention is to provide a quartz crystal wristwatch wherein temperature compensating data is based upon actual weather data and the temperature of the worn wristwatch.

Still another object of this invention is to provide a quartz crystal wristwatch which has integrated circuits for temperature compensation.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
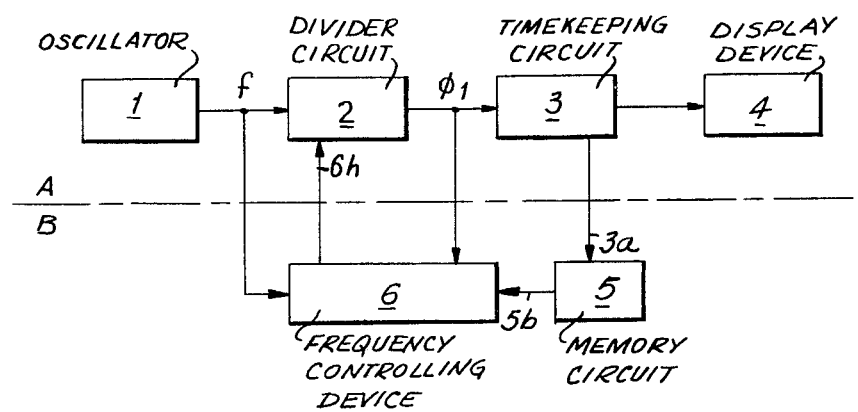
FIG. 1 is a functional block diagram of the quartz crystal wristwatch of this invention.

With reference to FIG. 1, the quartz crystal oscillator 1 generates a high frequency time standard signal f which is generally 32,768 Hz. For this oscillator 1, it is satisfactory to use either a non-temperature compensated oscillator or an oscillator which is only slightly temperature compensated by adding one condenser for purposes of temperature compensation. The divider circuit 2 is used for the purpose of providing the unit signal $\phi_1$ for timekeeping by dividing down from the original signal f. The unit signal $\phi_1$ is 1 Hz. The timekeeping circuit 3 provides: the time signal for one minute timekeeping, an hour timekeeping signal, a one-day timekeeping signal, and a one-month timekeeping signal, and a one-year timekeeping signal.—all derived from the 1 Hz signal $\phi_1$. The display device 4 displays the time which is kept by the timekeeping circuit 3 using the aforementioned minute, hour, day, month, and yearly signals from the timekeeping circuit 3, as well as the basic 1 Hz signal from the divider circuit 2. The memory circuit 5 stores the data necessary for frequency compensation on a monthly basis calculated from the monthly mean temperature of the wristwatch, at the time of wearing the wristwatch, or the data necessary for frequency compensation on an hourly basis calculated from the mean wearing temperature per hour in every month. The frequency compensation signal controlling circuit 6 reads out the frequency increment to be compensated, as determined by the memory circuit 5, and generates the frequency compensation signal 6h. Portion A of FIG. 1 shows the conventional timepiece functions. Portion B of FIG. 1 shows the functions which are provided according to this invention for temperature-frequency compensation.

Figure 2:
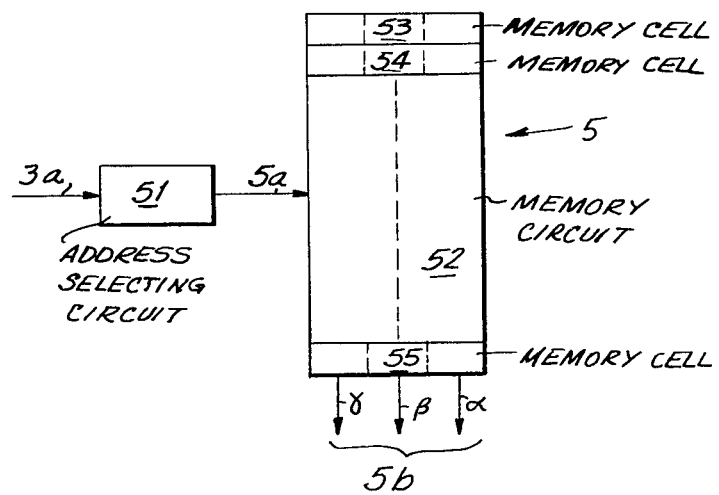
FIG. 2 is a functional block diagram of the memory circuit of FIG. 1.

FIG. 2 is a block diagram of the memory circuit 5 shown in FIG. 1. This is an example of a circuit for applying the compensation signal in every month from January to December according to a compensation value which is calculated from the mean wearing temperature of the wristwatch during every month. The same can be said when the temperature change per hour in every month is taken into consideration so as to obtain a more accurate compensation signal. When the signal 3a, which is derived from the one-month timekeeping signal in the timekeeping circuit 3, for showing the months of January to December, is inputted, the address selecting circuit 51 generates the address selecting signal 5a for designating the proper read-out address in the memory circuit 52 for the present month. The memory circuit 52 has a twelve-word construction wherein each compensation value, one for each month from January to December, is programmed. The contents of the address, that is, an address for an individual month, designated by the address selecting signal 5a is read out and outputted as the frequency compensation signal 5b. Memory cell 53 is used for storing the frequency value of compensation for the month of January. Likewise the memory cell 54 is for storing the frequency value for compensation for the month of February, etc. and finally the memory cell 55 is for storing the frequency value for compensation for the month of December. The bit construction in each word stored in memory 52 can be freely designed according to the frequency value to be compensated. In FIG. 2, a three-bit construction is shown for each word. The signals $\alpha$, $\beta$, and $\gamma$ correspond to respective bits in a single memory cell, e.g. cell 53, and are the respective bit components of the output signal 5b.

Figure 3:
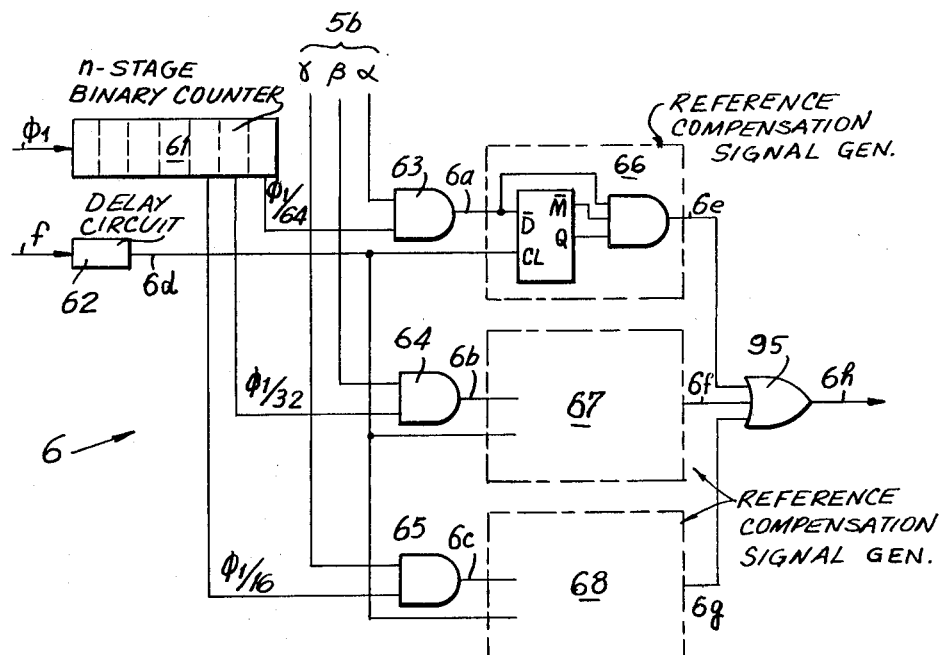
FIG. 3 is a functional block diagram of the frequency controlling circuit of FIG. 1.
Figure 4:
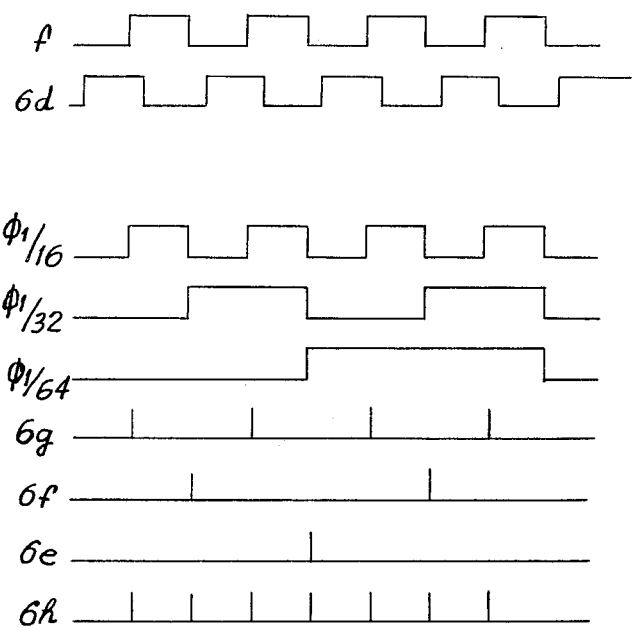
FIG. 4 is a timing diagram associated with the block diagram of FIG. 3.

FIG. 3 is the controlling circuit 6, provided for the purpose of generating the temperature compensation signal, which includes an n-stage binary counter 61. The number of stages can be readily determined according to the frequency of applying the compensation signal. When the input $\phi_1$ is a one-second signal, as in this embodiment, a seven-stage binary counter construction is provided because it is desirable to conduct the compensation in 60 seconds during which the second digit is carried up to the minute digit. With seven-stages in the binary counter, compensation is conducted in 64 seconds in the binary counter, but proper adjustment is accomplished at the time of calculating the amount to be compensated. AND gates 63, 64, 65 provide the logic product of the outputs $\phi_{1/64}$, $\phi_{1/32}$ and $\phi_{1/16}$ from the binary counters and the signals $\alpha$, $\beta$ and $\gamma$ from the memory circuit 52. By these AND gates, signals for making the compensation signal are selected. The clock signal 60 applied to circuits 66, 67, 68 via a delay circuit 62, is generated from the original signal f. Circuits 66, 67, 68 generate the reference compensation signals 6e, 6f and 6g using as inputs the outputs 6a, 6b, 6c from the AND gates 63, 64, 65 and delayed signal 6d. In this embodiment with seven-divider stages, the reference compensation signal 6e is outputted once in 64 seconds, the signal 6f is outputted twice and the signal 6g is outputted four times per 64 seconds. These signals 6e, 6f, 6g are adapted so as not to be outputted simultaneously with one another, and to have proper time intervals. The signal 6h out of the OR gate 95 is the logic sum of the reference compensation signals 6e, 6f and 6g which is applied to the divider 2 as the frequency compensation signal. The timing relationship among the signals is shown in FIG. 4, however it should be readily understood that for the sake of clarity an expanded time scale is used for the signals f and 6d. The pulses 6e, f, g, h have finite width.

Figure 5:
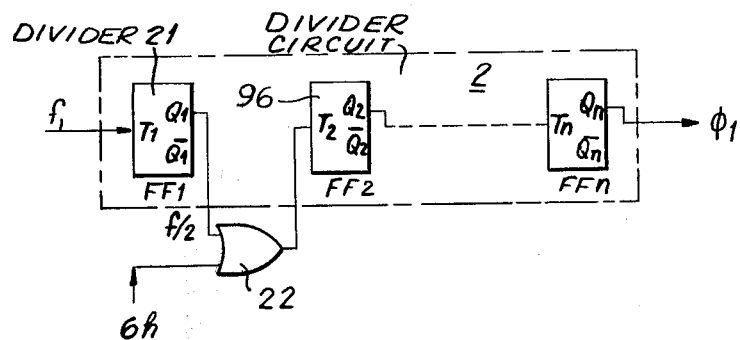
FIG. 5 is a functional block diagram of the divider circuit of FIG. 1.
Figure 6:
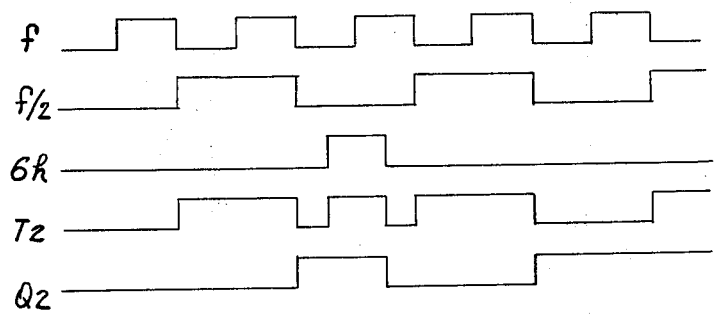
FIG. 6 is a timing chart associated with the block diagram of FIG. 5.

FIG. 5 is a circuit by which the frequency compensation signal 6h is applied to the divider 2. Divider stage 21 outputs the signal f/2 with an input signal f. In a conventional divider, this signal f/2 is the input to the next ½ divider stage. However, in this invention, the logic sum of the signal f/2 and the signal 6h is applied to the next ½ divider stage 96 via the OR gate 22. In this case, the signal 6h is applied when the signal f/2 is at its Low potential level. Furthermore, the signal 6h is adapted by means of the delay circuit 62 and the reference compensation signal generating circuits 66, 67, 68 to have a timing by which the frequency is never mistakenly divided in the next ½ divider 96. The timing relationships among the signals is shown in FIG. 6. Note that without the occurrence of the signal 6h the input $T_2$ to the flip-flop FF2 would be f/2. Also note that the signal $T_2$ includes the signal 6h in a position where it does not overlap the conventional f/2 signal. Thus it is truly an additional pulse into the flip-flop FF2. Accordingly the output 22 of the flip-flop FF2 is accelerated as indicated by the signal $Q_2$ in FIG. 6.

It should be noted in the circuit of FIG. 3 and the associated waveforms of FIG. 4, that the signal 5b, comprised of the bits $\alpha$, $\beta$, $\gamma$, enables the AND gates 63, 64, 65 whose outputs are fed to the inputs of flip-flops in the reference signal generators 66, 67, 68 respectively. The outputs 6e, 6f and 6g of the signal generators which provide the compensating pulses to the divider circuit 2, occur in synchronism with the positive-going edges of the waveforms from the binary counters 61 which feed the AND gates 63, 64, 65.

Figure 7:
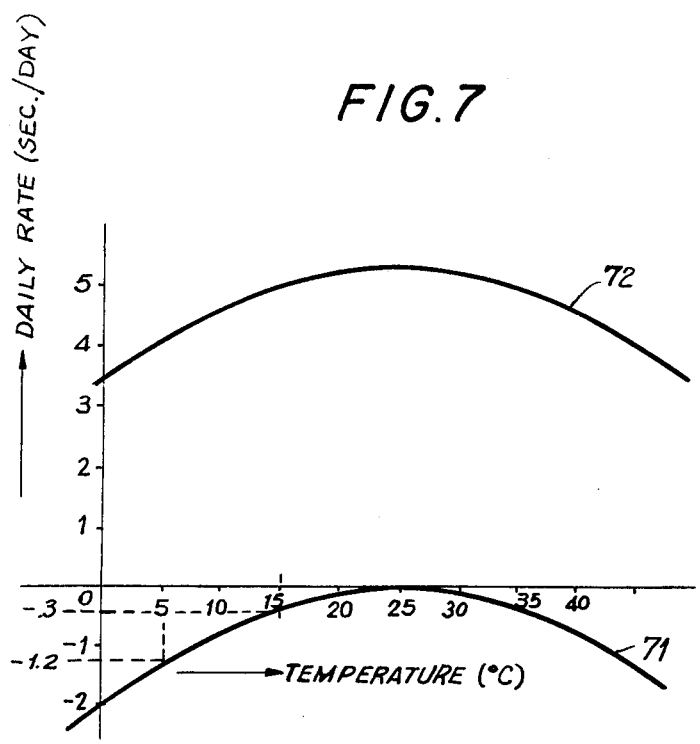
FIG. 7 is a graph of the frequency-temperature characteristic of a quartz crystal oscillator.

FIG. 7 is a graph showing the temperature-frequency characteristic when a flexure quartz crystal vibrator is used in the quartz crystal oscillator 1 of FIG. 1. The characteristic is generally expressed mathematically $$F = a(\theta - \theta_{MAX})^2 + b$$

where a is a quadratic temperature coefficient, $\theta_{MAX}$ is the highest (maximum) temperature, b is a constant and $\theta$ is a variable temperature. F is the frequency variation and required adjustment. In FIG. 7, the frequency F is converted into units of daily rate (seconds/day) and the highest temperature is fixed to be the normal temperature of (25° C.). The basic oscillator frequency is adjusted to the temperature characteristic 71 of daily rate so that the daily rate is 0 at the highest temperature (25° C.). Accordingly, in reading characteristic 71 of FIG. 7, when no frequency adjustment is made, the daily rate is −0.3 seconds/day when the variable temperature differs by ±10° C. from the highest value (25° C.), and is −1.2 seconds when the variable temperature differs from the highest temperature (25° C.) by ±20° C.

For the sake of an example, it is assumed that the signal 6h (FIGS. 5, 6) is applied to the OR gate 22 once a second. Then, (f/2 +1) pulses are outputted from OR gate 22 although normally f/2 pulses are expected in a single second to generate at the output terminal of OR gate 22. Effectively this added pulse per second shifts the daily rate value at 25° C. in the temperature characteristic upward by a value of 86,400/(F/2 +1). When the basic oscillator signal f is 32,768 Hz, the upward shift of the curve is equivalent to the daily rate of 5.2731156 seconds per day. However if the signal 6h is applied once in 64 seconds rather than once per second as described above, the daily rate is shifted by 5.27/64=0.082 seconds (approximately) in the positive direction if the wristwatch is sensed every 64 seconds. Note in the characteristic 71 that the signal f becomes less in response to all temperatures other than at the 25° C. point on the curve. Accordingly, signals 6h, which input additional pulses to the divider 2 serves at all temperatures because the correction is always in the positive direction. When the temperature difference from the highest point 25° C. is 20° C., the daily rate is 5.2731890 seconds per day (f=32,767.544 Hz) when a corrective pulse 6h is applied once a second. This daily rate is very small and is little different from that at 25° C. So the temperature characteristic of daily rate when the signal 6h is applied once a second, almost equals the characteristic 72 which is obtained by shifting the characteristic 71 upwards by the daily rate of 5.27 seconds as described above. Thus to obtain a daily rate which is near 0, except at the 25° C. point, the ratio of the daily rate difference of 5.27 seconds between curves 71 and 72, to the daily rate difference between the temperature characteristic curve 71 and the abscissa showing the daily rate of 0, is taken into consideration. For example, with a temperature differing from the 25° C. point by 20° C., (1.2/5.27)×64=15 (approximately). Thus it is satisfactory that 15 pulses 6h are applied to the divider 2 in 64 seconds. As stated above, when the pulses 6h are applied, the signal divider circuit distributes the signal pulses 6h as evenly as possible in the period of 64 seconds so that the pulses do not overlap.

Figure 8:
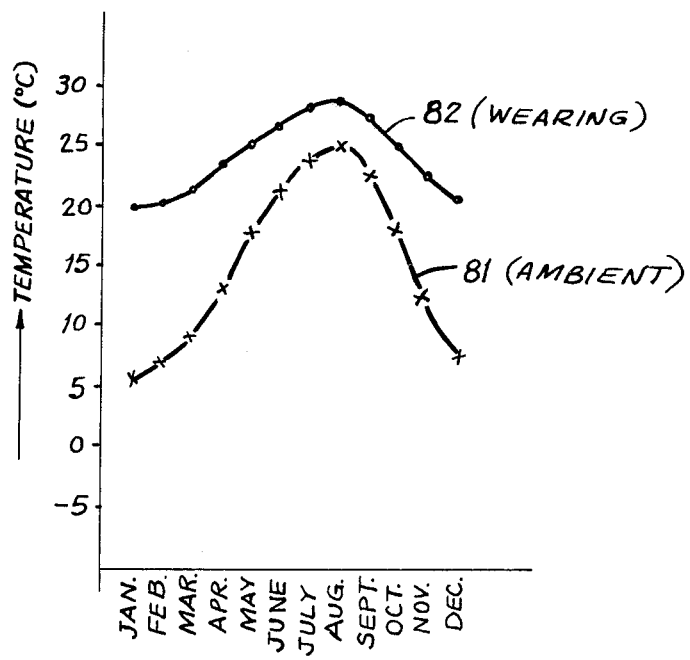
FIG. 8 is a graph showing ambient temperature and worn watch temperature in relation to the month of the year.

FIG. 8 is a graph illustrating the mean ambient temperature 81 for every month of the year at a selected locality, and the mean wearing temperature 82 of a wristwatch worn in that locality. The compensation which is required for the worn wristwatch is calculated by applying the mean wearing temperature characteristic 82 to the daily rate/temperature characteristic 71 shown in FIG. 7. For example, in FIG. 8 the mean wearing temperature of the wristwatch in the month of February is 20° C. It is seen from the temperature characteristic 71 of FIG. 7 that in this condition the amount to be compensated for is minus 0.1 seconds/day (est.) Accordingly, 1 pulse needs to be applied in 64 seconds. The number of "1" is programmed in the memory cell 54 for the month of February in the memory circuit 52 of FIG. 2. The stored number is in a binary bit format.

When one stage is added to the binary counter 61, a compensation signal based on a time unit of 128 seconds is obtained. In this instance, temperature compensation is done approximately every two minutes. However, only 0.041 seconds is added by applying one compensation signal 6h and hence a more refined temperature compensation is accomplished. When an oscillator having simple temperature compensation is used in a wristwatch of this invention, the accuracy is much improved by setting the unit time for the compensation signals 6h at 128 seconds or more. It is also beneficial to the overall accuracy in adjustment to make the original oscillator frequency f higher.

It should be apparent that the wearing temperature of the wristwatch on the arm of a person varies according to the wearing conditions and the different localities. However good average values can be set. On the other hand, it is also possible to vary specifications to match the different localities. Because the oscillator remains very simple and the temperature compensating circuits described above are integrated into an integrated circuit board, power consumption is small as compared with the situation where temperature compensation is performed directly in the oscillator.

The same result can be achieved in another embodiment in which the time interval is programmed in the memory means according to the frequency deviation which is to be compensated. The compensation signal is adapted for application at properly determined frequencies during the aforementioned time interval.

Figure 9:
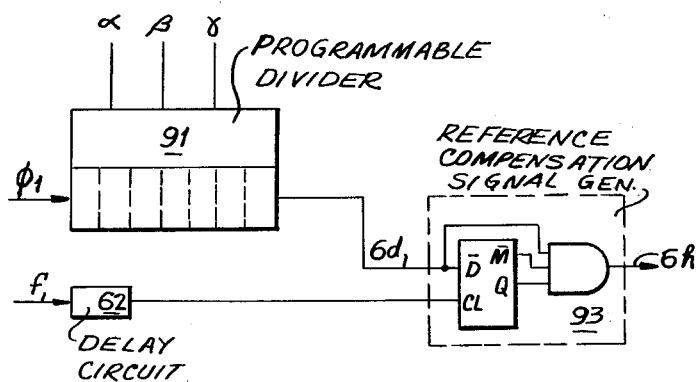
FIG. 9 is an alternative embodiment of the frequency control circuit of FIG. 3.

FIG. 9 shows an alternative embodiment of the wristwatch of this invention. In FIG. 9, the dividing ratio of the programmable divider 91 is determined by the data α, β, γ, representative of periodic frequency correction in the memory means 52. In this manner, the frequency of application of a correction signal is determined by the stored data. The signal 6d is outputted during the time intervals according to the aforementioned frequency amount to be compensated, and the compensation signal 6h is outputted during the time intervals. The compensation signal 6h is applied to the divider which receives the oscillator frequency f, and the performance thereafter is as described in reference to the embodiment shown in FIG. 1.

In summarizing, according to this invention, the oscillator of the wristwatch may be a very simple structure and the temperature compensation is accomplished by integrated circuit elements. As a result the wristwatch is miniaturized, the cost is lowered, and high accuracy is obtained. Thus, this invention is very advantageous for wristwatches.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A quartz crystal wristwatch with temperature compensation, comprising:
   a quartz crystal oscillator outputting a high frequency signal;
   a divider for providing a low frequency output signal from said high frequency signal, said divider reducing said high frequency signal in stages;
   timekeeping means operating on said divider output to provide timekeeping data;
   a display whereby said timekeeping data is presented to the user;
   memory means having a plurality of addresses for storing predetermined temperature compensating data in said plurality of addresses, said predetermined temperature compensating data being representative of the mean wearing temperature of said wristwatch at a given time of year, said predetermined temperature compensating data stored in said memory means being independent of changes in ambient temperature, said memory means receiving signals of said timekeeping data from said timekeeping means and outputting signals representative of said temperature compensation data; and
   means for applying said outputted signals from said memory means to said divider, whereby the rate of said timekeeping data is modified in accordance with the temperature compensating data representative of the mean wearing temperature of the wristwatch at the given time of the year.

2. The quartz crystal wristwatch of claim 1, wherein said means for applying said outputted compensation data includes a decoder, said decoder receiving said outputted compensation data and producing pulse signals for compensation therefrom, said pulse signals being applied to said divider.

3. The quartz crystal wristwatch of claim 2, wherein said pulse signals are applied at an intermediate stage of said divider.

4. The quartz crystal wristwatch of claim 3, wherein said pulse signals are added at said intermediate stage of said divider whereby the outputs of said intermediate stage, said divider and said timekeeping means are accelerated.

5. The quartz crystal wristwatch of claim 3, wherein said pulse signals are applied to said intermediate stage of said divider when the signal to said intermediate stage from the preceding stage of said divider is Low.

6. The quartz crystal wristwatch of claim 2 or 5, wherein said compensation data is in words composed of binary bits, each bit when applied to said decoder producing said pulse signals at a different repetition rate.

7. The quartz crystal wristwatch of claim 6, wherein said pulse signals generated by each bit never coincide with pulse signals generated by another bit, whereby the total modification to said timekeeping data is the additive output of said bit products.

8. The quartz crystal wristwatch of claim 1, wherein said memory means includes an address selector, said address selector receiving said signals of present time from said timekeeping means and selecting the address of said corresponding data for output from storage.

9. The quartz crystal wristwatch of claim 6, wherein said stored compensating data represent a plurality of time segments, one of said words in memory being associated with each of said time segments.

10. The quartz crystal wristwatch of claim 9, wherein said words are derived from a correlation of mean temperature during said associated time segment and the frequency error in said quartz crystal oscillator at said mean temperature.

11. The quartz crystal wristwatch of claim 10, wherein each of said time segments is one month in duration.

12. The quartz crystal wristwatch of claim 10, wherein each of said time segments is one hour in duration.

13. The quartz crystal wristwatch of claim 2 or 1, wherein said compensation data is derived from a correlation of mean temperatures during a year and the frequency errors in said quartz crystal oscillator at said mean temperatures.

14. The quartz crystal wristwatch of claim 10, wherein said mean temperatures are associated with a particular geographic locality.

15. The quartz crystal wristwatch of claim 10, wherein said mean temperatures are the temperatures of the worn wristwatch.

16. The quartz crystal wristwatch of claim 7, wherein said pulse signals are delivered in a fixed interval of time.

17. The quartz crystal wristwatch of claim 2, wherein said decoder means includes a programmable divider, said outputted portion of said stored data for compensation being applied to said programmable divider, whereby said pulse signals are delivered over an interval of time, said interval of time being varied in duration by said outputted compensation data.

18. In an electronic wristwatch including quartz crystal oscillator means for producing a high frequency signal, divider means for producing a low frequency output signal having a predetermined frequency rate in response to said high frequency signal, timekeeping circuit means for receiving said low frequency output signal and in response thereto producing timekeeping signals representative of actual time, display means for displaying actual time in response to said timekeeping signals, the improvement comprising memory means having a plurality of addresses for storing predetermined temperature compensation data in said plurality of addresses, said predetermined temperature compensation data being representative of the mean wearing temperature of the wristwatch at a given time of year, said predetermined temperature compensation data stored in said memory means being independent of changes in ambient temperature, said memory means receiving said timekeeping signals and in response thereto applying to said divider means a frequency rate adjustment signal determined by the temperature compensation data in said addresses, the predetermined frequency rate of said low frequency output signal produced by said divider means being adjusted by the frequency rate adjustment signal being applied thereto.

19. The electronic wristwatch as claimed in claim 18, wherein said memory means includes address selector means for receiving said timekeeping signals and in response thereto selecting one of said addresses so that a frequency rate adjustment signal representative of said predetermined temperature compensation data stored in said address is applied to said divider means.

20. The electronic wristwatch as claimed in claim 19, wherein said memory means further includes frequency controlling means for applying said frequency rate adjustment signal determined by said temperature compensation data in said address selected by said address selector means to said divider means.

* * * * *